United States Patent
Pei

(10) Patent No.: US 8,673,123 B2
(45) Date of Patent: Mar. 18, 2014

(54) MAGNETRON SPUTTERING DEVICE HAVING ROTATABLE SUBSTRATE HOLDER

(75) Inventor: Shao-Kai Pei, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 1159 days.

(21) Appl. No.: 12/568,800

(22) Filed: Sep. 29, 2009

(65) Prior Publication Data

US 2010/0294658 A1 Nov. 25, 2010

(30) Foreign Application Priority Data

May 25, 2009 (CN) .......................... 2009 1 0302600

(51) Int. Cl.
- *C23C 14/00* (2006.01)
- *C25B 11/00* (2006.01)
- *C25B 13/00* (2006.01)

(52) U.S. Cl.
USPC ..................................... 204/298.18

(58) Field of Classification Search
USPC ..................................... 204/298.18
See application file for complete search history.

(56) References Cited

U.S. PATENT DOCUMENTS

| | | | | |
|---|---|---|---|---|
| 4,407,713 A | * | 10/1983 | Zega | 204/298.22 |
| 4,851,095 A | * | 7/1989 | Scobey et al. | 204/192.12 |
| 5,421,979 A | * | 6/1995 | Stevenson | 204/298.25 |
| 5,795,448 A | * | 8/1998 | Hurwitt et al. | 204/192.1 |
| 2002/0190387 A1 | * | 12/2002 | Raina et al. | 257/765 |
| 2004/0026240 A1 | * | 2/2004 | Shidoji et al. | 204/298.03 |
| 2006/0000705 A1 | * | 1/2006 | Hartig et al. | 204/192.12 |
| 2006/0137968 A1 | * | 6/2006 | Hartig | 204/192.1 |

FOREIGN PATENT DOCUMENTS

| | | |
|---|---|---|
| CN | 101082123 A | 12/2007 |
| CN | 101285171 A | 10/2008 |

* cited by examiner

*Primary Examiner* — Roy King
*Assistant Examiner* — Jenny Wu
(74) *Attorney, Agent, or Firm* — Altis Law Group, Inc.

(57) ABSTRACT

A magnetron sputtering device includes a target holder, a substrate holder, and a first driver. The target holder defines a sputtering space therein, and includes at least one target tray arranged at a periphery of the sputtering space. The substrate holder is rotatably positioned in the sputtering space. The first driver is connected to the substrate holder. The first driver is operable to rotate the substrate holder relative to the target holder.

7 Claims, 3 Drawing Sheets

MAGNETRON SPUTTERING DEVICE HAVING ROTATABLE SUBSTRATE HOLDER

BACKGROUND

1. Technical Field

The present disclosure relates to magnetron sputtering devices, and particularly to a magnetron sputtering device that includes a rotatable substrate holder.

2. Description of Related Art

A typical magnetron sputtering device includes a target holder for holding targets, and a substrate holder for holding substrates to be coated. During deposition of coats or films on the substrates, the substrate holder is generally kept still. As such, a portion of the film formed on a part of a substrate not directly facing a corresponding target may be thinner than other portions of the film formed. That is, the substrate may be irregularly coated with the film.

Therefore, it is desirable to provide a magnetron sputtering device which can overcome the above-mentioned problems.

DETAILED DESCRIPTION

Embodiments of the present disclosure will now be described in detail with reference to the drawings.

Figure 1:
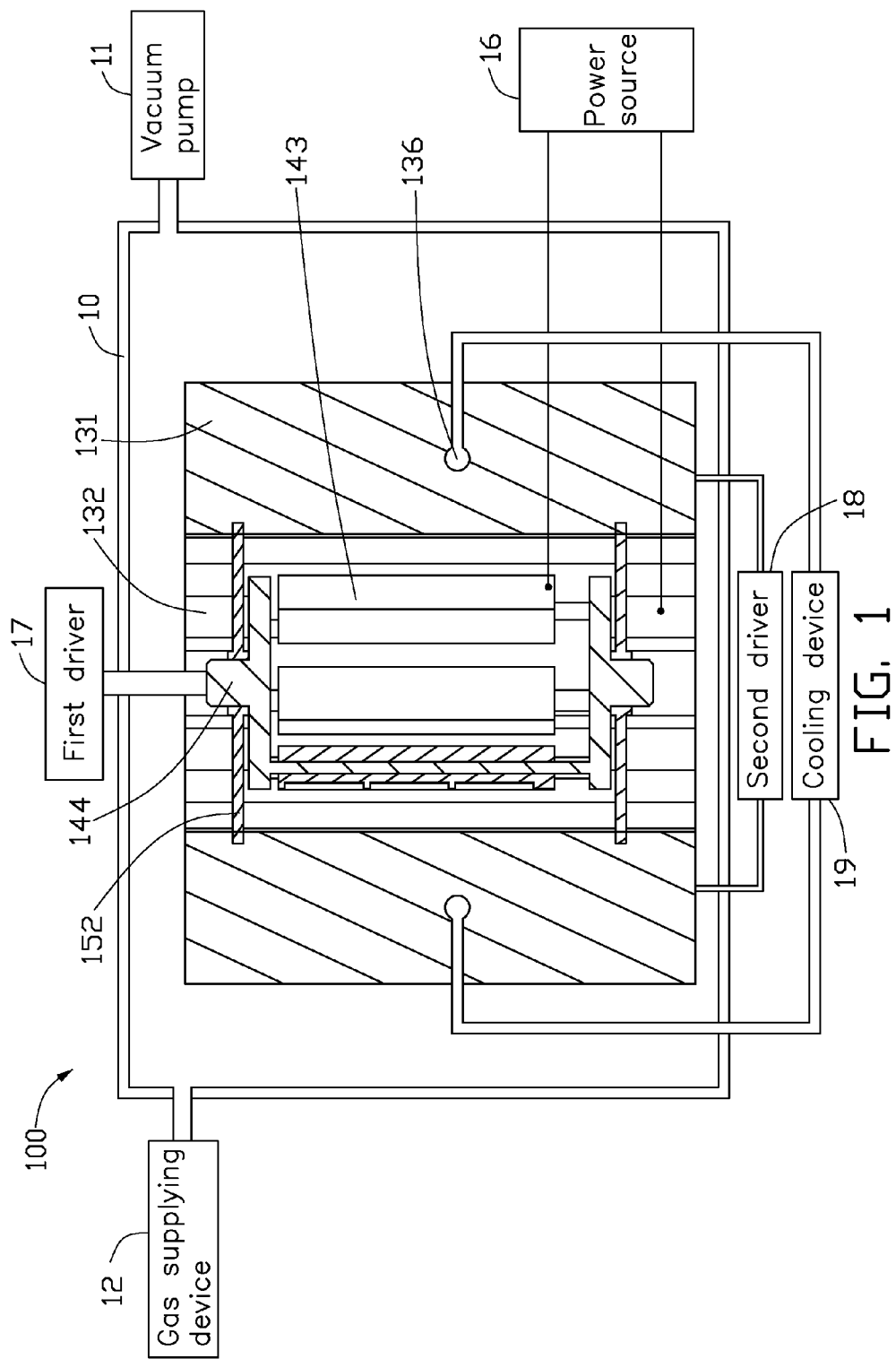
FIG. 1 is a schematic, cutaway view of a magnetron sputtering device, according to an exemplary embodiment.
Figure 2:
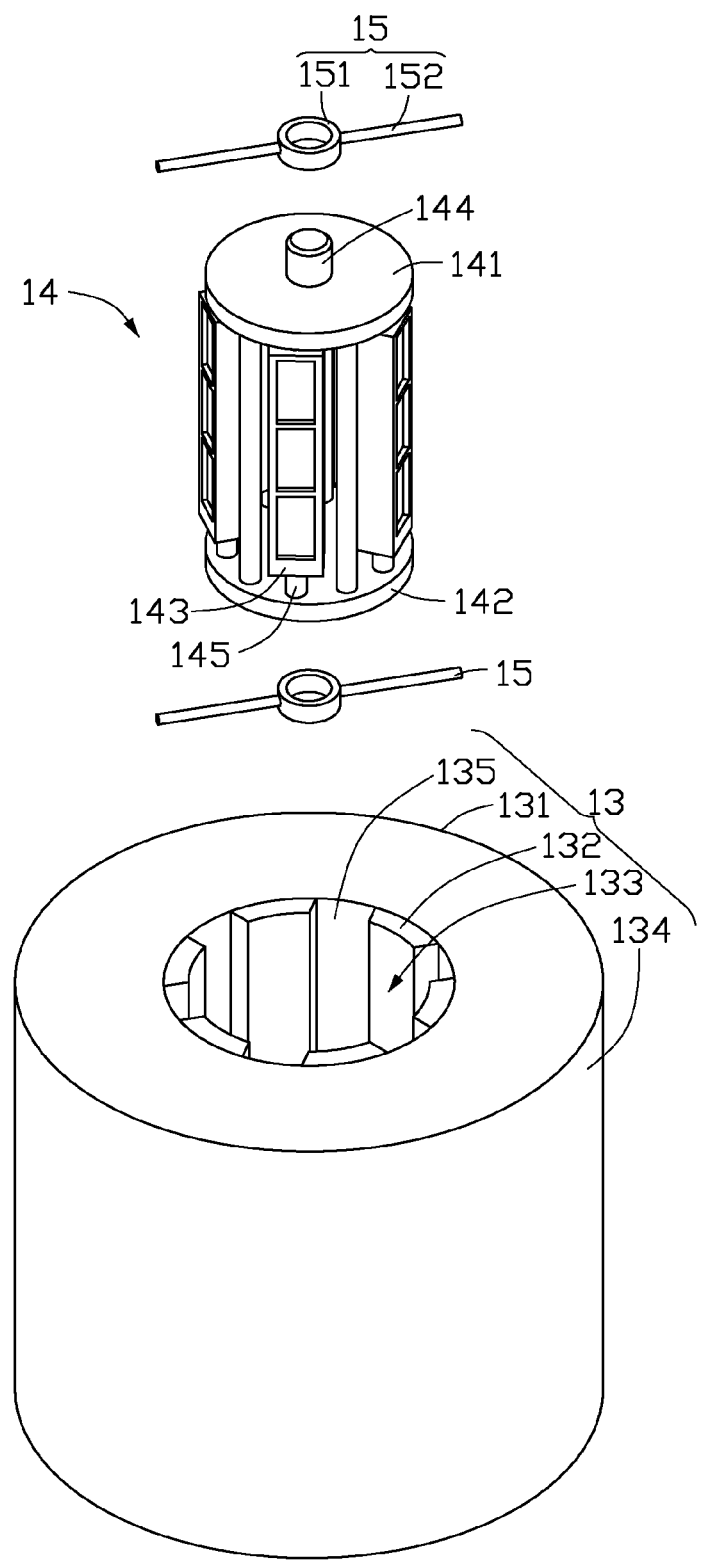
FIG. 2 is an exploded, isometric view of a target holder, two connecting members, and a substrate holder of the magnetron sputtering device of FIG. 1.

Referring to FIGS. 1-2, a magnetron sputtering device 100, according to an exemplary embodiment, includes a vacuum chamber 10, a vacuum pump 11, a gas supplying device 12, a target holder 13, a substrate holder 14, two connecting members 15, a power source 16, a first driver 17, a second driver 18, and a cooling device 19.

The vacuum chamber 10 is operable to provide a vacuum reaction space (not labeled).

The vacuum pump 11 is connected to the vacuum chamber 10, and is operable to remove air and other matter from the vacuum chamber 10.

The gas supplying device 12 is connected to the vacuum chamber 10, and is operable to supply reactant gas such as argon to the vacuum chamber 10.

The target holder 13 includes a body 131 and six target trays 132. The body 131 is cylindrical and hollow, and defines a sputtering space 133 in a center thereof. The body 131 includes a cylindrical outer surface 134, and a cylindrical inner surface 135 generally bounding the sputtering space 133. The target trays 132 are elongate and electrically conductive, and are arranged on the inner surface 135 such that they are equally angularly spaced from one another. Each target tray 132 is operable to hold a target (not shown). The target holder 13 further includes a cooling pipe 136 disposed in the body 131. The cooling pipe 136 holds coolant, which circulates through the cooling pipe 136 in the body 131 thereby cooling the body 131.

The substrate holder 14 includes a circular top plate 141, a circular bottom plate 142, a number of columns 145, a number of substrate trays 143, and two pivot shafts 144. The top plate 141 and the bottom plate 142 are similar in shape. One end of each column 145 is connected to the top plate 141, and the other end of each column 145 is connected to the bottom plate 142. The columns 145 are arranged along a generally circular path such that they are equally angularly spaced from one another. As such, the top plate 141 and the bottom plate 142 are coaxially connected with each other via the columns 145. In this embodiment, each substrate tray 143 is fixed to a corresponding column 145. Each substrate tray 143 is operable to hold three substrates (not shown). In this embodiment, the substrate trays 143 are electrically conductive. One of the pivot shafts 144 extends out from the center of the top plate 141 at a side of the top plate 141 opposite from the side where the columns 145 are. The other pivot shaft 144 extends down from the center of the bottom plate 142 at a side of the bottom plate 142 opposite from the side where the columns 145 are. As such, the two pivot shafts 144 are coaxial with the top plate 141 and bottom plate 142 and with each other.

Each connecting member 15 includes an annular bearing 151, and two connecting rods 152 fixed to opposite sides of the annular bearing 151. An inner diameter of the annular bearing 151 is substantially equal to a diameter of each pivot shaft 144.

Figure 3:
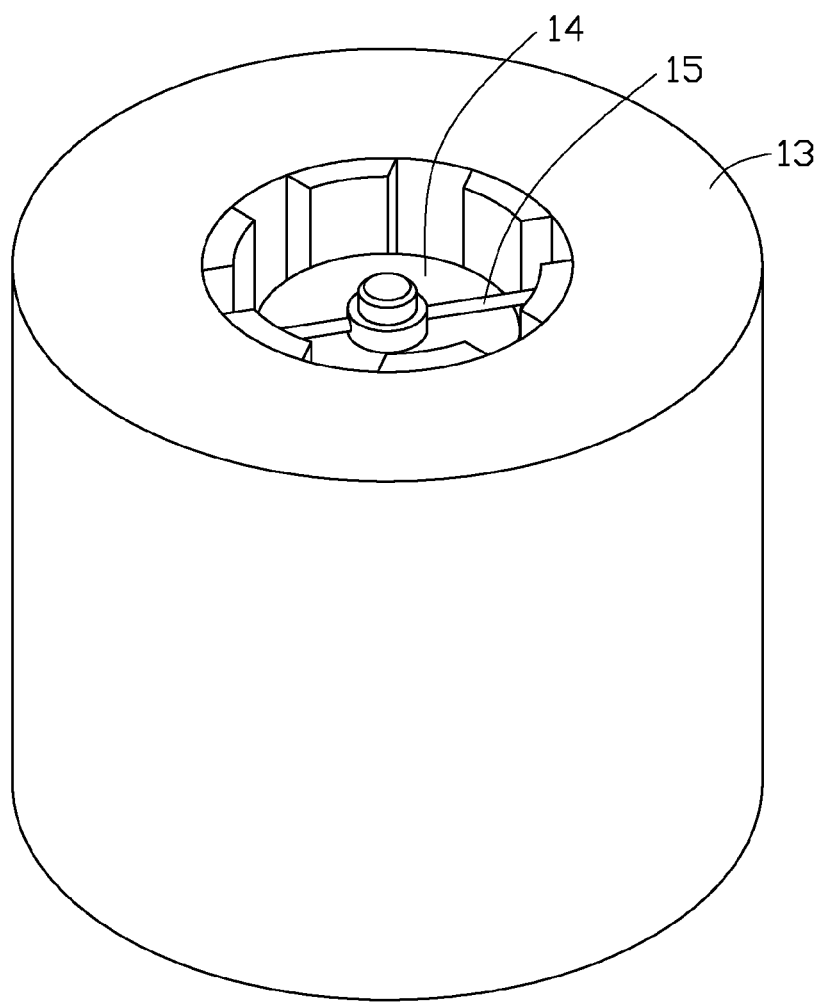
FIG. 3 is an assembled view of the target holder, the connecting members, and the substrate holder of FIG. 2.

Also referring to FIG. 3, in assembly, each pivot shaft 144 is rotatably sleeved by a corresponding annular bearing 151. The rods 152 of each connecting member 15 are fixed to opposite portions of the inner surface 135. As such, the substrate holder 14 is rotatably held in the center of the sputtering space 133, and the substrate trays 143 can directly face the target trays 132. Then, the subassembly of the target holder 13, the substrate holder 14 and the connecting members 15 is received in the vacuum chamber 10.

The anode of the power source 16 is connected to the substrate trays 143, and the cathode of the power source 16 is connected to the target trays 132. The power source 16 is operable to generate an electric field between the target trays 132 and the substrate trays 143. In practice, the electric field intensity is strong enough to sufficiently ionize the reactant gas.

The first driver 17 is connected to the substrate holder 14, and is operable to rotate the substrate holder 14 about the shared central axis of the pivot shafts 144. In this embodiment, the first driver 17 is connected to the pivot shaft 144 of the top plate 141.

The second driver 18 is connected to the body 131, and is operable to rotate the target holder 13 about the central axis of the pivot shafts 144.

The cooling device 19 is connected to two ends of the cooling pipe 136. The cooling device 19 is operable to supply coolant to one end of the cooling pipe 136, and remove hot or warm coolant from the other end of the cooling pipe 136.

In use, targets and substrates are fixed to the target trays 132 and the substrate trays 143 correspondingly. Then, the vacuum pump 11 pumps air and other matter from the vacuum chamber 10 to create a vacuum reaction space in the vacuum chamber 10. The gas supplying device 12 supplies reactant gas to the vacuum chamber 10. The power source 16 generates an electric field between the target trays 132 and the substrate trays 143. The sputtering space 133 is filled with the reactant gas, which is ionized to plasma including ions and electrons. The ions accelerate in the electric field and bombard the targets. Accordingly, a large number of atoms or molecules of the targets are sputtered away from the targets to the substrates to form films on the substrates. During the deposition of the films, the first driver 17 rotates the substrate holder 14 relative to the target holder 13, such that each portion of a surface of each substrate is located directly opposite any one target for a period of time substantially the same as the period of time each other portion of the surface of the substrate is located directly opposite the same target. As such, a thickness of the film formed on the surface of each substrate can be very even (uniform). Furthermore, the second driver 18 rotates the target holder 13 to homogenize the plasma generated. Moreover, during the sputtering, the cooling device 19 continues to supply coolant to the cooling pipe 136, such that the temperature of the target holder 13 and of the targets can be maintained at an acceptable level.

While various exemplary and preferred embodiments have been described, it is to be understood that the disclosure is not limited thereto. To the contrary, various modifications and similar arrangements (as would be apparent to those skilled in the art) are intended to also be covered. Therefore, the scope of the appended claims should be accorded the broadest interpretation so as to encompass all such modifications and similar arrangements.

What is claimed is:

1. A magnetron sputtering device comprising:
   a target holder being hollow shaped and defining a sputtering space therein, the target holder comprising an inner surface bounding the sputtering space and at least one target tray arranged on the inner surface;
   a substrate holder rotatably positioned in the sputtering space and comprising at least one substrate tray, a top plate, a bottom plate, and at least one column interconnecting the top plate and the bottom plate, the top plate and the bottom plate coaxially connected with each other via the at least one column, and the at least one substrate tray facing the at least one target tray and being disposed on the at least one column;
   two connecting members, each connecting member comprising an annular bearing and two connecting rods fixed to opposite sides of the annular bearing;
   a first driver connected to the substrate holder, the first driver being operable to rotate the substrate holder relative to the target holder; and
   a second driver connected to the target holder, the second driver being operable to rotate the target holder relative to the substrate holder;
   wherein the substrate holder further comprises two pivot shafts, each pivot shaft extends out from a corresponding one of the top plate and the bottom plate at a side of the corresponding one of the top plate and the bottom plate opposite from the side where the at least one column is located, each pivot shaft is sleeved by a corresponding one of the annular bearings, the connecting rods of each connecting member are fixed to the inner surface of the target holder, and one of the pivot shafts is operably connected to the first driver.

2. The magnetron sputtering device of claim 1, further comprising a vacuum chamber in which the target holder and the substrate holder are received.

3. The magnetron sputtering device of claim 2, further comprising a vacuum pump connected to the vacuum chamber, the vacuum pump being operable to remove air and other matter from the vacuum chamber.

4. The magnetron sputtering device of claim 2, further comprising a gas supplying device connected to the vacuum chamber, the gas supplying device being operable to supply reactant gas to the vacuum chamber.

5. The magnetron sputtering device of claim 1, further comprising a power source, one terminal of the power source being electrically connected to the target holder, another terminal of the power source being electrically connected to the substrate holder, the power source being operable to generate an electric field between the target holder and the substrate holder.

6. The magnetron sputtering device of claim 5, wherein an anode of the power source is connected to the substrate holder, and a cathode of the power source is connected to the target holder.

7. The magnetron sputtering device of claim 1, further comprising a cooling device, the target holder further comprising a cooling pipe disposed therein, the cooling device being connected to two ends of the cooling pipe and configured to supply coolant to the cooling pipe for cooling the target holder.

\* \* \* \* \*